US007633319B2

(12) United States Patent
Arai

(10) Patent No.: US 7,633,319 B2
(45) Date of Patent: Dec. 15, 2009

(54) DIGITAL QP DETECTING APPARATUS, SPECTRUM ANALYZER HAVING THE SAME, AND DIGITAL QP DETECTING METHOD

(75) Inventor: Michiaki Arai, Gunma (JP)

(73) Assignee: Advantest Corporation, Tokyo (JP)

( * ) Notice: Subject to any disclaimer, the term of this patent is extended or adjusted under 35 U.S.C. 154(b) by 756 days.

(21) Appl. No.: 10/596,056

(22) PCT Filed: Nov. 18, 2004

(86) PCT No.: PCT/JP2004/017517

§ 371 (c)(1),
(2), (4) Date: Jun. 21, 2006

(87) PCT Pub. No.: WO2005/052606

PCT Pub. Date: Jun. 9, 2005

(65) Prior Publication Data

US 2007/0173217 A1 Jul. 26, 2007

(30) Foreign Application Priority Data

Nov. 28, 2003 (JP) ............................... 2003-399189

(51) Int. Cl.
*H03K 5/153* (2006.01)

(52) U.S. Cl. .......................... 327/60; 375/260; 455/214; 455/336

(58) Field of Classification Search .................... 327/60
See application file for complete search history.

(56) References Cited

U.S. PATENT DOCUMENTS 5,119,081 A    6/1992  Ikehira
7,085,334 B2 *  8/2006  Burke et al. ................. 375/345

FOREIGN PATENT DOCUMENTS

| DE | 10103481   | 8/2002  |
|----|------------|---------|
| EP | 0379050    | 7/1990  |
| JP | 2-183170   | 7/1990  |
| JP | 5-136833   | 6/1993  |
| JP | 2002-350474| 12/2002 |

OTHER PUBLICATIONS

English Language Abstract of JP 2-183170.

* cited by examiner

*Primary Examiner*—Lincoln Donovan
*Assistant Examiner*—John W Poos
(74) *Attorney, Agent, or Firm*—Greenblum & Bernstein, P.L.C.

(57) ABSTRACT

A QP detection unit includes digital circuit elements. There is provided a digital QP detector which detects an electric power signal Vi, which is an input signal, and outputs a detection signal Vo. The digital QP detector includes a register which records input digital data, a first multiplier which multiplies the digital data recorded in the register by a first coefficient, a second multiplier which multiplies the digital data recorded in the register by a second coefficient, an adder which adds the electric power signal Vi and the output from the first multiplier to each other, a comparator which compares the level of the electric power signal Vi and the level of the detection signal Vo, and a first switch which switches the digital data to be fed to the register between the output from the adder (Vi>Vo) and the output from the second multiplier (Vi<Vo) based on a comparison result of the comparator. The output of the first switch is output as the detection signal Vo via a third multiplier and a latch.

9 Claims, 7 Drawing Sheets

DIGITAL QP DETECTING APPARATUS, SPECTRUM ANALYZER HAVING THE SAME, AND DIGITAL QP DETECTING METHOD

TECHNICAL FIELD

The present invention relates to making a detector by using digital circuit elements.

BACKGROUND ART

Conventionally, a spectrum analyzer includes a QP detecting (quasi-peak detecting) unit constituted by an analog circuit. The QP detection is a detecting method prescribed by the CISPER standard, and is used to measure the EMC.

The QP detection unit serves as a charge circuit if an output voltage Vo is higher than an input voltage Vi, and serves as a discharge circuit if the input voltage Vi is higher than the output voltage Vo.

A patent document 1 (Japanese Laid-Open Patent Publication (Kokai) No. H5-136833) discloses a circuit which includes analog circuit elements (resistors and capacitors) in a detection circuit, though the circuit does not carry out the QP detection.

However, there is an on-going trend to make a unit which processes an intermediate frequency signal in spectrum analyzers by using digital circuit elements. Thought it is thus desirable to make the QP detection unit by using the digital circuit elements, there poses a problem of how the QP detection unit is constituted by using the digital circuit elements.

It is an object of the present invention to make the QP detection unit by using the digital circuit elements.

DISCLOSURE OF THE INVENTION

According to an aspect of the present invention, a digital QP detecting apparatus that detects an input signal and outputs a detection signal, includes: a register that records an input digital data; a first multiplier that multiplies the digital data recorded in the register by a first coefficient, and outputs the product; a second multiplier that multiplies the digital data recorded in the register by a second coefficient, and outputs the product; an adder that adds the input signal and the output from the first multiplier to each other; a level comparing unit that compares the level of the input signal and the level of the detection signal with each other; and a first switch that switches the digital data fed to the register between an output from the adder and the output from the second multiplier based on a comparison result by the level comparing unit, wherein the detection signal is generated based on an output from the first switch.

According to the thus constructed digital QP detecting apparatus, a digital QP detecting apparatus that detects an input signal and outputs a detection signal can be provided.

A register records an input digital data. A first multiplier multiplies the digital data recorded in the register by a first coefficient, and outputs the product. A second multiplier multiplies the digital data recorded in the register by a second coefficient, and outputs the product. An adder adds the input signal and the output from the first multiplier to each other. A level comparing unit compares the level of the input signal and the level of the detection signal with each other. A first switch switches the digital data fed to the register between an output from the adder and the output from the second multiplier based on a comparison result by the level comparing unit. The detection signal is generated based on an output from the first switch.

The thus constructed digital QP detecting apparatus may includes a third multiplier that generates the detection signal by multiplying the output from the first switch by a third coefficient.

According to the thus constructed digital QP detecting apparatus, the third coefficient may be obtained by subtracting the first coefficient from 1.

According to the thus constructed digital QP detecting apparatus, the first switch (i) may select the output from the adder as the digital data fed to the register if the level of the input signal is higher than the level of the detection signal; and (ii) may select the output from the second multiplier as the digital data fed to the register if the level of the input signal is lower than the level of the detection signal.

The thus constructed digital QP detecting apparatus may includes: a latch that records a signal based on the output from the first switch, and updates the recorded signal at a predetermined period; and a second switch that switches the reciprocal of the predetermined period between the data rate of the input signal and a rate smaller than the data rate of the input signal based on the comparison result by the level comparing unit.

According to the thus constructed digital QP detecting apparatus, the second switch (i) may set the reciprocal of the predetermined period to the data rate of the input signal if the level of the input signal is higher than the level of the detection signal; and (ii) may set the reciprocal of the predetermined period to the rate smaller than the data rate of the input signal if the level of the input signal is less than the level of the detection signal.

Further, a spectrum analyzer may include the thus constructed digital QP detecting apparatus.

Furthermore, a spectrum analyzer may include: an electric power signal converting unit that converts a signal to be measured to an electric power signal; the thus constructed digital QP detecting apparatus that detects the electric power signal and outputs a detection signal; and an extreme value detecting unit that detects an extreme value of the detection signal.

According to another aspect of the present invention, a digital QP detecting method of detecting an input signal and outputting a detection signal, includes: a recording step of recording an input digital data; a first multiplying step of multiplying the digital data recorded in the recording step by a first coefficient, and outputting the product; a second multiplying step of multiplying the digital data recorded in the recording step by a second coefficient, and outputting the product; an adding step of adding the input signal and the output from the first multiplying step to each other; a level comparing step of comparing the level of the input signal and the level of the detection signal with each other; and a switching step of switching the digital data recorded in the recording step between an output from the adding step and the Output from the second multiplying step based on a comparison result by the level comparing step, wherein the detection signal is generated based on an output from the switching step.

BEST MODE FOR CARRYING OUT THE INVENTION

A description will now be given of an embodiment of the present invention with reference to drawings.

Figure 1:
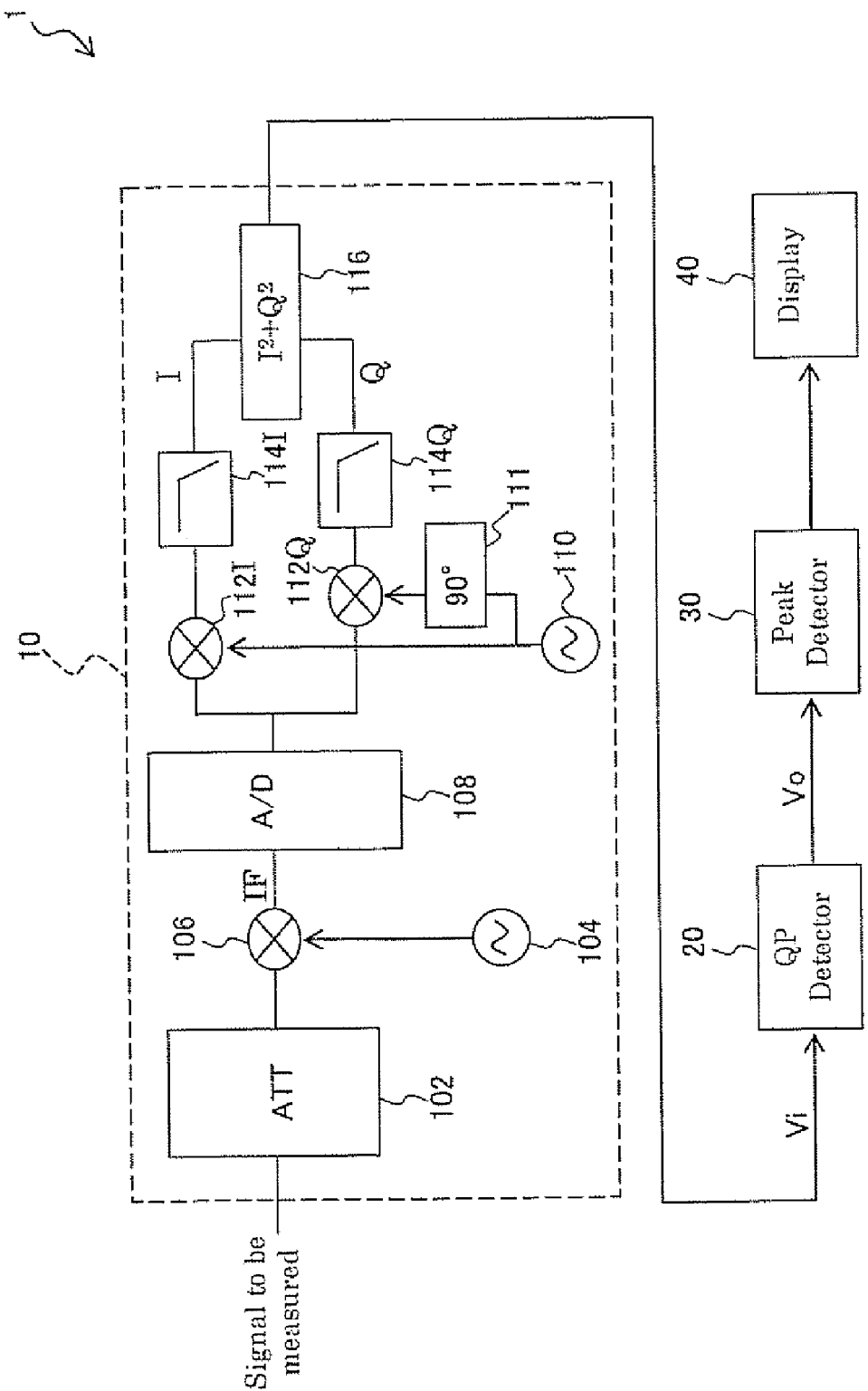
FIG. 1 is a block diagram showing the configuration of a spectrum analyzer 1 provided with a QP detector 20 according to an embodiment of the present invention.

FIG. 1 is a block diagram showing the configuration of a spectrum analyzer 1 provided with a QP detector 20 according to the embodiment of the present invention. The spectrum analyzer 1 includes an electric power signal conversion unit 10, the QP detector 20, a peak detector (extreme value detecting means) 30, and a display 40.

The electric power signal conversion unit 10 converts a signal to be measured into an electric power signal, and outputs the electric power signal. The electric power signal conversion unit 10 includes an attenuator 102, an oscillator 104, a mixer 106, an A/D converter 108, an oscillator 110, a 90-degree phase shifter 111, mixers 112I and 112Q, low-pass filters 114I and 114Q, and an electric power conversion unit 116.

The attenuator 102 attenuates the level of the signal to be measured. The oscillator 104 outputs a signal having a predetermined local frequency. The mixer 106 mixes the signal output from the attenuator 102 with the signal having the local frequency output from the oscillator 104, and outputs an IF (Intermediate Frequency) signal. The A/D converter 108 converts the IF signal, which is an analog signal, into a digital signal. The oscillator 110 outputs a signal having a predetermined orthogonal transform frequency. The 90-degree phase shifter 111 shifts the phase of the signal having the orthogonal transform frequency output from the oscillator 110 by 90 degrees, and outputs a resulting signal. The mixer 112I mixes the output from the A/D converter 108 and the signal having the orthogonal transform frequency output from the oscillator 110 with each other, and outputs a resulting signal. The mixer 112Q mixes the output from the A/D converter 108 and the signal output from the 90-degree phase shifter 111 with each other, and outputs a resulting signal. The mixers 112I and 112Q carry out the orthogonal conversion. A high frequency component of the output from the mixer 112I is cut by the low-pass filter 114I, a high frequency component of the output from the mixer 112Q is cut by the low-pass filter 114Q, and resulting signals are fed to the electric power conversion unit 116. The electric power conversion unit 116 receives the I signal from the low-pass filter 114I and the Q signal from the low-pass filter 114Q, calculates I signal$^2$+Q signal$^2$, thereby obtaining the electric power of the signal to be measured. The electric power conversion unit 116 outputs the obtained electric power as an electric power signal Vi.

Figure 2:
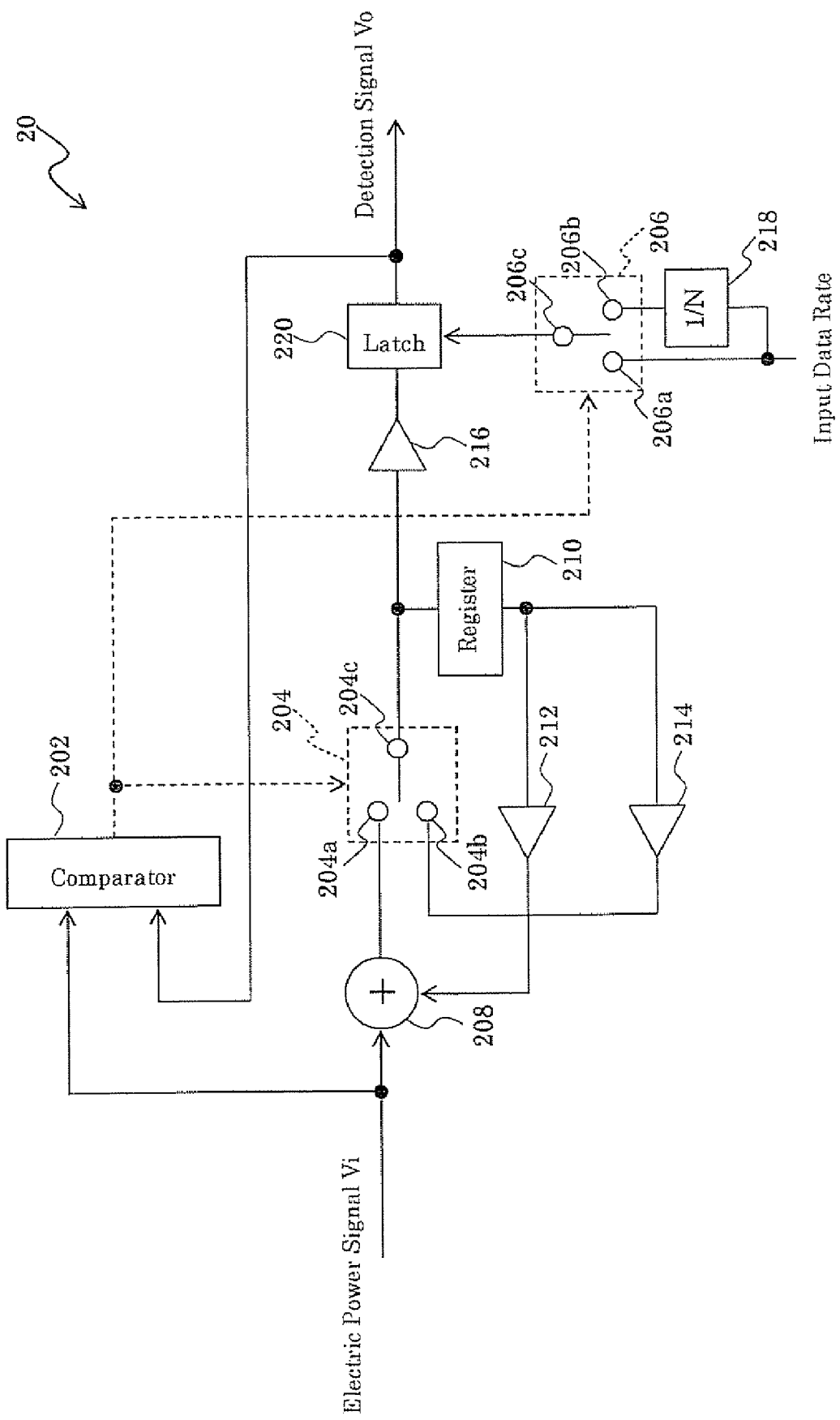
FIG. 2 is a block diagram showing the configuration of the QP detector 20.

The QP detector 20 detects the electric power signal Vi output from the electric power conversion unit 10, and outputs a detection signal Vo. FIG. 2 is a block diagram showing the configuration of the QP detector 20. The QP detector 20 is provided with a comparator (level comparing means) 202, a first switch 204, a second switch 206, an adder 208, a register 210, a first multiplier 212, a second multiplier 214, a third multiplier 216, a divider 218, and a latch 220.

The comparator (level comparing means) 202 compares the level (voltage) of the electric power signal Vi and the level (voltage) of the detection signal Vo. A result of the comparison is transmitted to the first switch 204 and the second switch 206.

Figure 3:
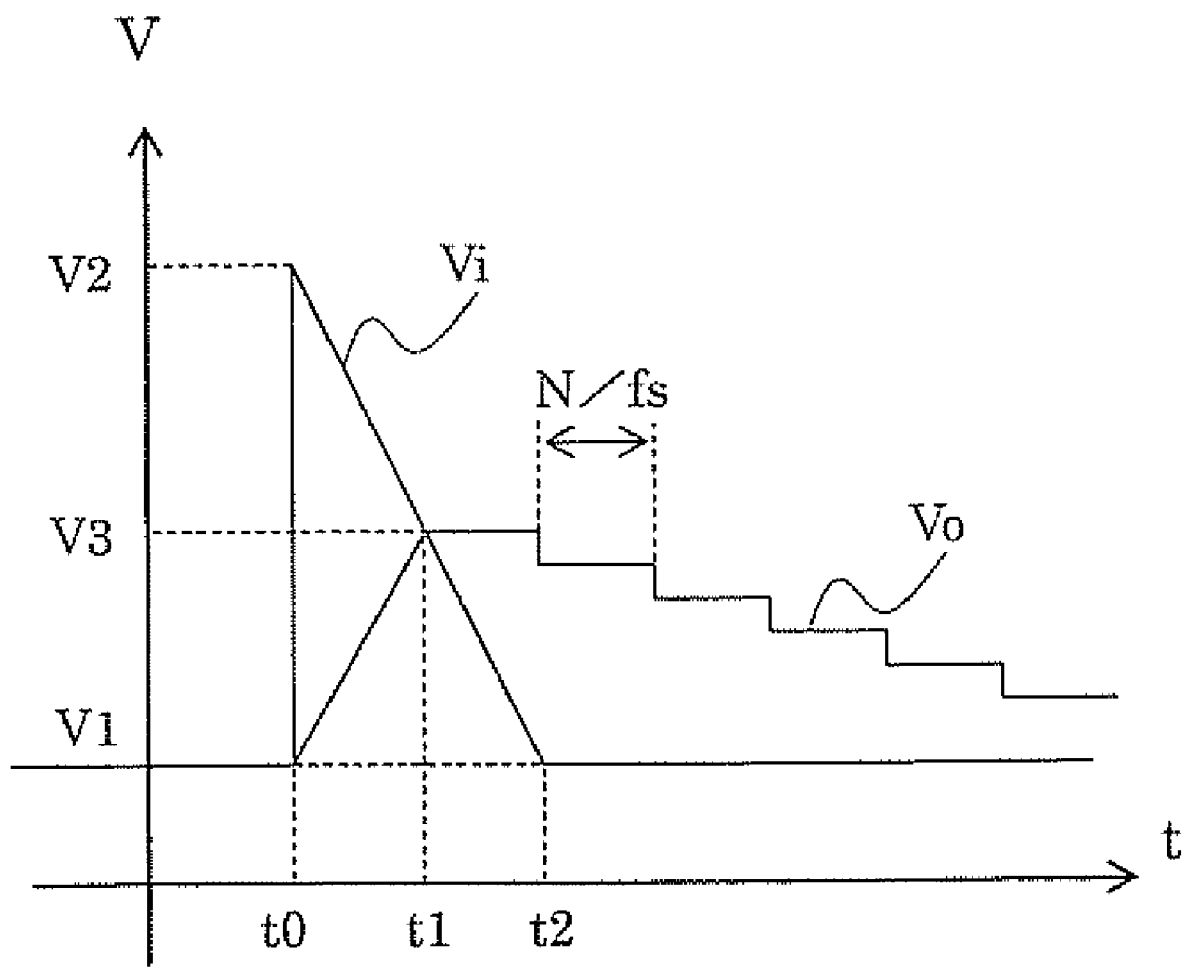
FIG. 3 is a diagram showing a waveform of an electric power signal Vi and a waveform of a detection signal Vo.

FIG. 3 shows the waveform of the electric power signal Vi and the waveform of the detection signal Vo. It is assumed that the waveform of the electric power signal Vi is a saw tooth waveform. Namely, the level rises instantaneously from V1 to V2 at a time point t0. The level then linearly decreases to V1 until a time point t2. Then, the level remains at V1.

On this occasion, as for the waveform of the detection signal Vo, the level (voltage) of the detection signal Vo linearly increases from the time point t0 to a time point t1 (t1<t2), and reaches V3. After the time point t1, the level (voltage) of the detection signal Vo repeats such a behavior as maintaining a constant value for a certain time period (N/fs, fs: input data rate [Hz]), then decreasing, and further maintaining a constant value for the certain time period. The level thus gradually approaches the level V1.

For the waveforms shown in FIG. 3, the electric power signal Vi is larger than the detection signal Vo from the time point t0 to the time point t1. After the time point t1, the electric power signal Vi is less than the detection signal Vo.

The first switch 204 includes terminals 204a, 204b, and 204c. The terminal 204a is connected to an output side of the adder 208. The terminal 204b is connected to an output side of the second multiplier 214. The terminal 204c is connected to an input side of the register 210 and an input side of the third multiplier 216. The first switch 204 connects the terminal 204a and the terminal 204c with each other if the electric power signal Vi is larger than the detection signal Vo. As a result, digital data fed to the register 210 is the output from the adder 208. If the electric power signal Vi is less than the detection signal Vo, the first switch 204 connects the terminal 204b and the terminal 204c with each other. As a result, the digital data fed to the register 210 is the output from the second multiplier 214.

The second switch 206 includes terminals 206a, 206b, and 206c. The terminal 206a is a terminal which outputs a signal representing the input data rate (sampling frequency of the electric power signal Vi). The terminal 206b is connected to the divider 218. The terminal 206c is connected to the latch 220. The second switch 206 connects the terminal 206a and the terminal 206c with each other if the electric power signal Vi is larger than the detection signal Vo. As a result, a clock frequency fed to the latch 220 is the input data rate. The second switch 206 connects the terminal 206b and the terminal 206c with each other if the electric power signal Vi is less than the detection signal Vo. As a result, the clock frequency fed to the latch 220 is represented as [Input data rate]/N. It should be noted that N is an integer equal to or larger than 2. N is 100, for example.

The adder 208 adds the electric power signal Vi and the output from the first multiplier 212, and outputs the sum.

The register 210 records the input digital data.

The first multiplier 212 reads out the digital data recorded in the register 210, multiplies the digital data by a first coefficient (gain1), and outputs the product.

The second multiplier 214 reads out the digital data recorded in the register 210, multiplies the digital data by a second coefficient (gain2), and outputs the product.

The third multiplier 216 multiplies the signal output from the terminal 204c of the first switch 204 by a third coefficient, and outputs the product. It should be noted that the third coefficient is represented as 1−gain1. The Output from the third multiplier 216 is recorded in the latch 220, and is further output from the latch 220 as the detection signal Vo.

The divider 218 divides the frequency of the signal of the input data rate by N (N is 100, for example), and outputs a resulting signal to the terminal 206b.

The latch 220 receives and records the signal output from the terminal 204c of the first switch 204 via the third multiplier 216. The latch 220 then updates the recorded signal at a predetermined period which is the reciprocal of the fed clock frequency. The recorded signal is output as the detection signal Vo.

The peak detector 30 detects a peak (maximal value) of the detection signal output from the QP detector 20.

The display 40 displays the peak detected by the peak detector 30 as a chart and the like.

A description will now be given of an operation of the embodiment of the present invention.

First, the signal to be measured is fed to the electric power signal conversion unit 10. After the level of the signal to be measured is attenuated by the attenuator 102, the signal to be measured is mixed by the mixer 106 with the signal having the local frequency output from the oscillator 104 resulting in the IF signal. The IF signal is converted into the digital signal by the A/D converter 108. The output from the A/D converter 108 is further mixed with the signal having the orthogonal conversion frequency by the mixer 112I, and the high frequency component of the mixed signal is cut by the low-pass filter 114I, resulting in the I signal. Moreover, the output from the A/D converter 108 is mixed with the signal output from the 90-degree phase shifter 111 by the mixer 112Q, and the high frequency component of the mixed signal is cut by the low-pass filter 114Q, resulting in the Q signal. The electric power conversion unit 116 calculates I signal$^2$+Q signal$^2$, thereby obtaining the electric power of the signal to be measured. The electric power conversion unit 116 outputs the obtained electric power as the electric power signal Vi. It is assumed that the waveform of the electric power signal Vi is the saw tooth waveform as shown in FIG. 3.

The QP detector 20 detects the electric power signal Vi output from the electric power conversion unit 10, and outputs the detection signal Vo.

Figure 4:
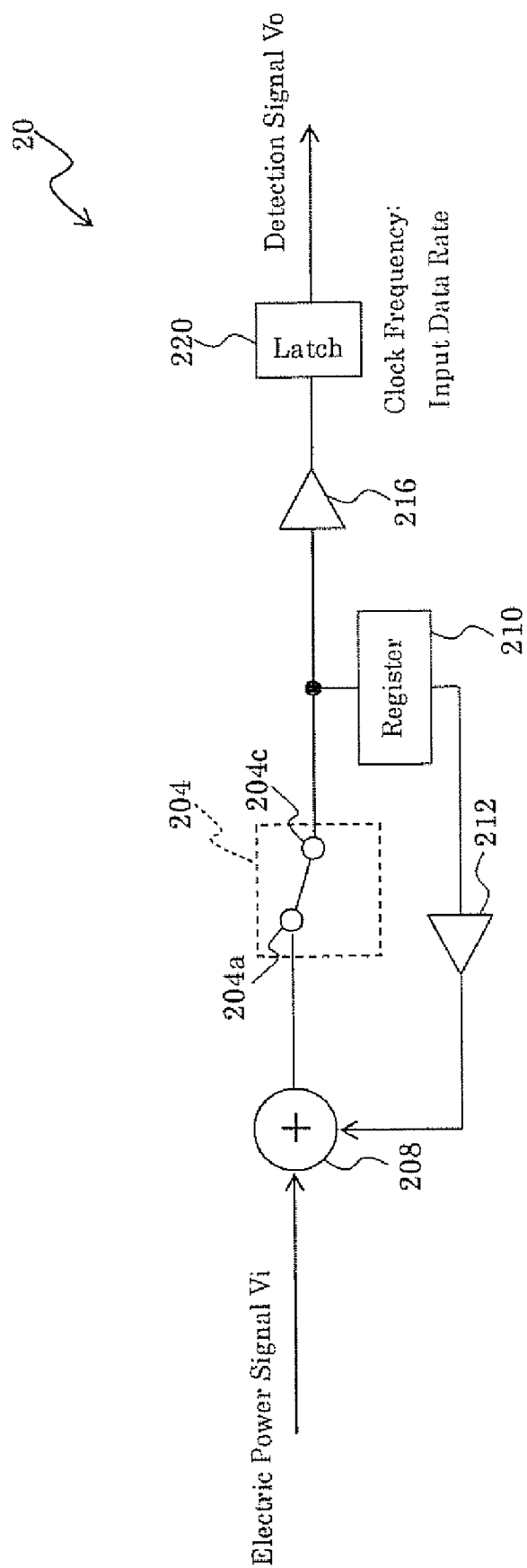
FIG. 4 is a diagram partially showing the configuration of the QP detector 20 in order to describe an operation of the QP detector 20 from a time point t0 to a time point t1.
Figure 5:
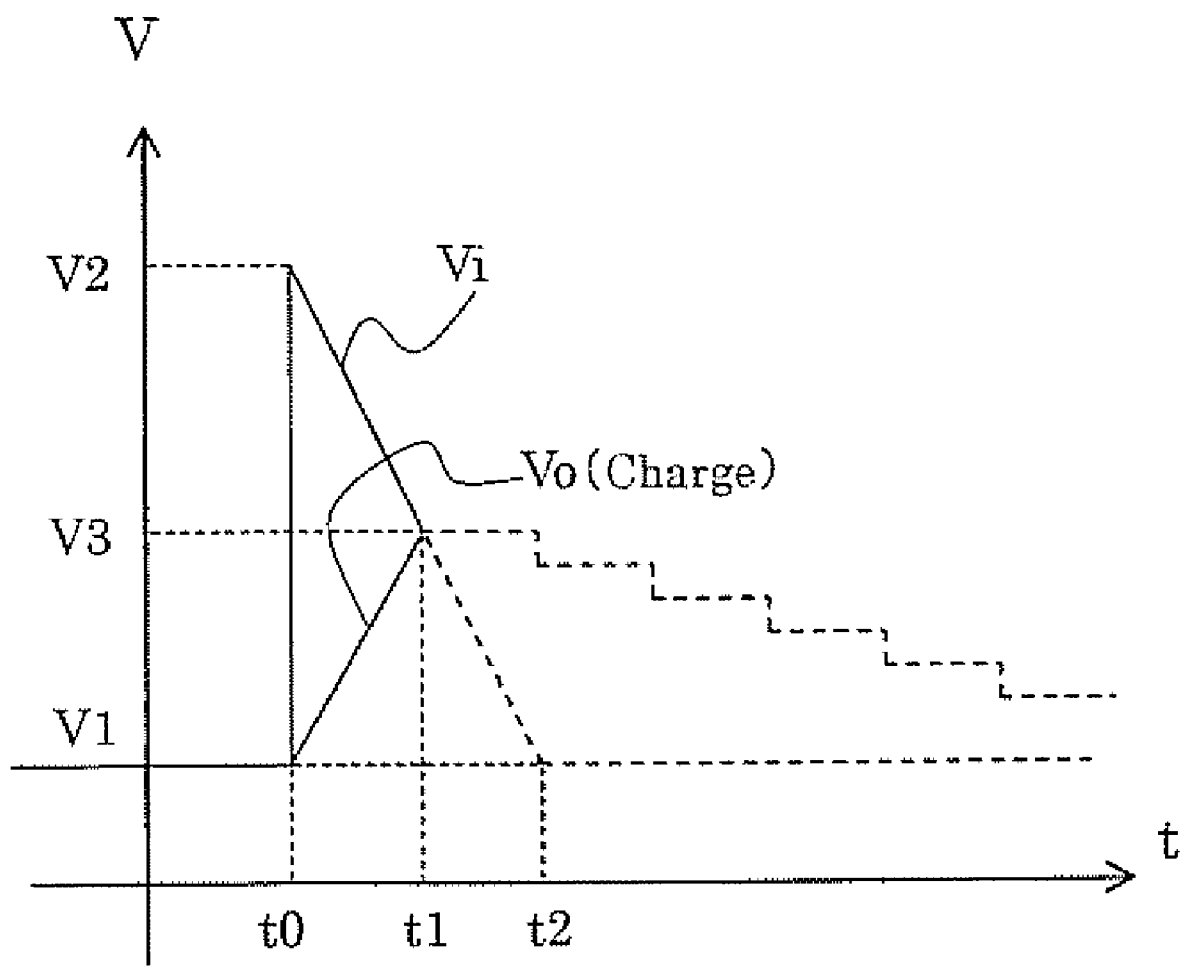
FIG. 5 is a diagram showing a waveform of an electric power signal Vi and a waveform of a detection signal Vo in order to describe an operation of the QP detector 20 from a time point t0 to a time point t1.

First, a description will be given of an operation of the QP detector 20 from the time point t0 to the time point t1. FIG. 4 partially shows the configuration of the QP detector 20 in order to describe the operation of the QP detector 20 from the time point t0 to the time point t1. FIG. 5 shows the waveforms of the electric power signal Vi and the detection signal Vo, and the waveforms from the time point t0 to the time point t1 are represented by solid lines.

The comparator 202 compares the level (voltage) of the electric power signal Vi and the level (voltage) of the detection signal Vo. With reference to FIG. 5, the electric power signal V1 is at the level (voltage) of V2, and the detection signal Vo is at the level (voltage) of V1 at the time point t0. Thus, at the time point to, there holds the relationship: [Electric power signal Vi]>[Detection signal Vo]. This result of the comparison is transmitted to the first switch 204 and the second switch 206.

The first switch 204 connects the terminal 204a and the terminal 204c with each other. With reference to FIG. 4, the digital data input to the register 210 is then read out, and is multiplied by the first coefficient (gain1) by the first multiplier 212. The output from the first multiplier 212 is added to the electric power signal Vi by the adder 208. The output from the adder 208 is then fed to the register 210. The digital data fed to the register 210 is also multiplied by the third coefficient (1−gain1) by the third multiplier 216, and is recorded in the latch 220.

The second switch 206 connects the terminal 206a and the terminal 206c with each other. As a result, the clock frequency fed to the latch 220 is the input data rate. The digital data recorded in the latch 220 is output as the detection signal Vo.

With reference to FIG. 5, the data recorded in the latch 220 can be considered as an Output of a kind of positive feedback circuit (refer to FIG. 4) constituted by the register 210, the first multiplier 212, and the adder 208, the level linearly increases. Namely, an operation as a charge circuit is carried out. On the other hand, since the waveform of the electric power signal Vi is the saw tooth waveform, the level linearly decreases. Since there holds the relationship: [Electric power signal Vi]>[Detection signal Vo] until the time point t1, the above operation continues.

Figure 6:
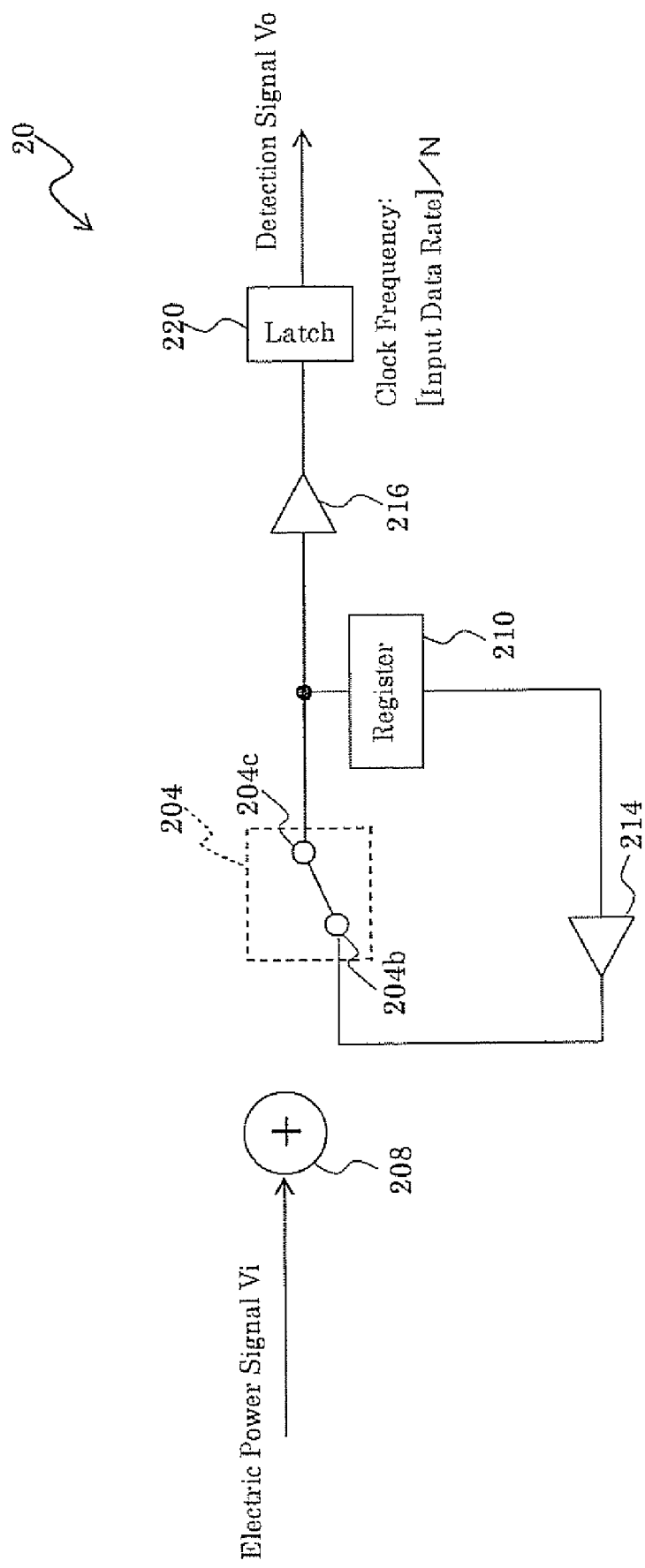
FIG. 6 is a diagram partially showing the configuration of the QP detector 20 in order to describe the operation of the QP detector 20 after the time point t1.
Figure 7:
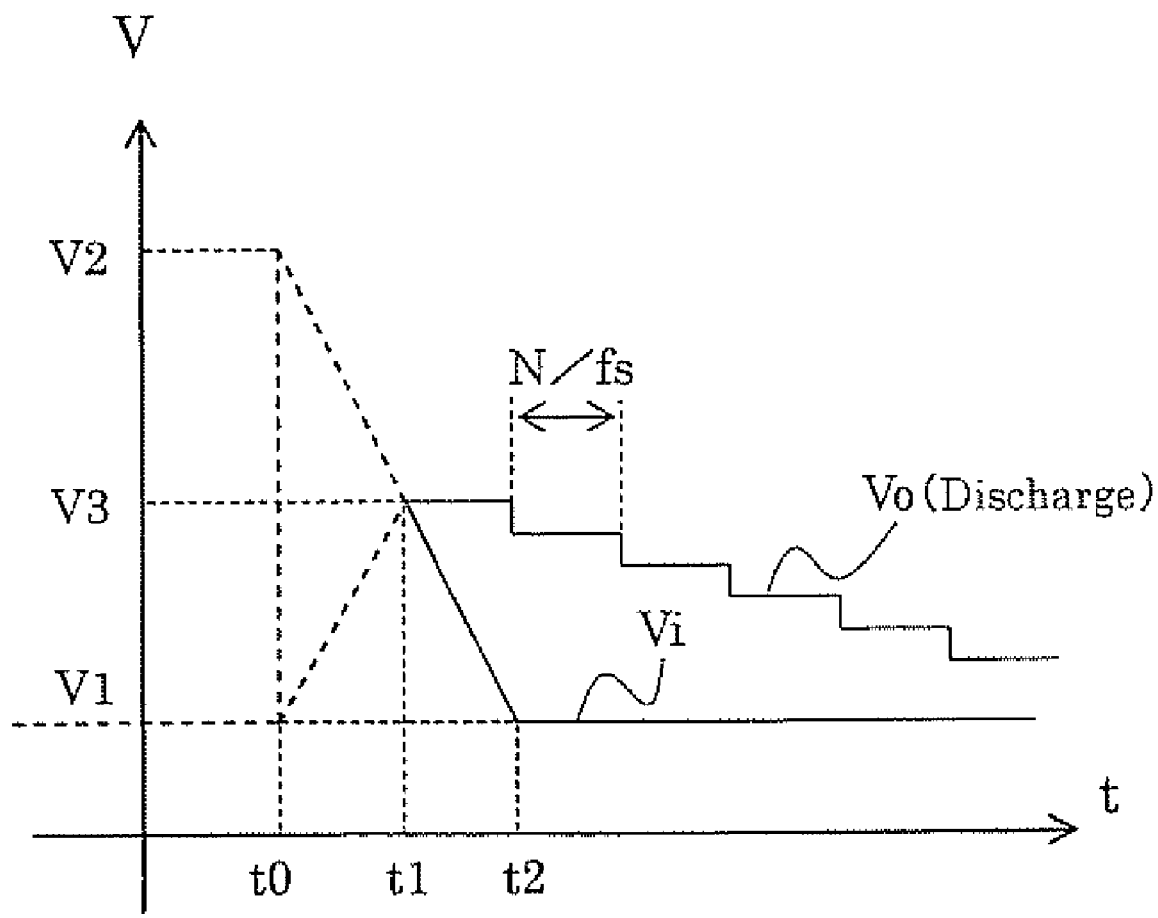
FIG. 7 is a diagram showing the waveforms of the electric power signal Vi and the detection signal Vo in order to describe the operation of the QP detector 20 after the time point t1.

A description will now be given of the operation of the QP detector 20 after the time point t1. FIG. 6 partially shows the configuration of the QP detector 20 in order to describe the operation of the QP detector 20 after the time point t1. FIG. 7 shows the waveforms of the electric power signal Vi and the detection signal Vo, and the waveforms after the time point t1 are represented by solid lines.

The comparator 202 compares the level (voltage) of the electric power signal Vi and the level (voltage) of the detection signal Vo. With reference to FIG. 7, the electric power signal Vi is at the level (voltage) of V3, and the detection signal Vo is at the level (voltage) of V3 at the time point t1. There thus holds the relationship: [Electric power signal Vi]< [Detection signal Vo] even slightly after the time point t1. This result of the comparison is transmitted to the first switch 204 and the second switch 206.

The first switch 204 connects the terminal 204b and the terminal 204c with each other. With reference to FIG. 6, the digital data input to the register 210 is then read Out, and is multiplied by the second coefficient (gain2) by the second multiplier 214. The Output from the second multiplier 214 is fed to the register 210. The digital data fed to the register 210 is also multiplied by the third coefficient: (1−gain1) by the third multiplier 216, and is recorded in the latch 220.

The second switch 206 connects the terminal 206b and the terminal 206c with each other. As a result, the clock frequency fed to the latch 220 is represented as [Input data rate]/N. The digital data recorded in the latch 220 is output as the detection signal Vo.

With reference to FIG. 7, since the data recorded in the latch 220 can be considered as an output from a kind of discharge circuit constituted by the register 210 and the second multiplier 214 (refer to FIG. 6), the level gradually degreases. Since the data recorded in the latch 220 is updated every period of N/[Input data rate], the data repeats such a behavior that the data maintains a certain value for the certain period (N/fs, fs: input data rate [Hz]), decreases, and then maintains again a certain value for the certain period. The level thus gradually approaches the level V1. On the other hand, since the waveform of the electric power signal Vi is the saw tooth waveform, the level linearly decreases. Since there holds the relationship: [Electric power signal Vi]<[Detection signal Vo] after the time point t1, the above operation continues.

The clock frequency fed to the latch 220 is set to [Input data rate]/N which is smaller than the input data rate in order to reduce the number of bits handled by the second multiplier 214 by increasing the change of the second coefficient (gain2) of the second multiplier 214 when the input data rate is changed.

It is assumed that fs: input data rate [Hz], τ1: charge time constant [sec], and τ2: discharge time constant [sec]. The first coefficient (gain1) and the second coefficient (gain2) are then expressed by the following equations.

gain1=Exp(-1/fs×τ1)

gain2=Exp(-1/fs×τ2)

The first coefficient (gain1) and the second coefficient (gain2) are thus represented by the following table 1.

TABLE 1

| fs[Hz] | τ1[msec] | gain1 | τ2[msec] | gain2 |
|---|---|---|---|---|
| 4 k | 45 | 0.99445 | 500 | 0.999500125 |
| 180 k | 1 | 0.99445 | 160 | 0.999965278 |
| 2.4 M | 1 | 0.999583 | 550 | 0.999999242 |

As the table 1 clearly shows, the second coefficient (gain2) has consecutive 9's down to six decimal places when the data rate fs is 2.4 MHz. When the data rate fs is 2.4 MHz, the second multiplier 214 should handle down to at least seven decimal places (down to five decimal places to allow a margin). This causes a large bit number handled by the second multiplier 214.

Thus the data rate is decreased on the discharge. For example, there is set the relationship: [Data rate on discharge] =[Input data rate]/100. The second coefficient (gain2) is then represented by the following table 2.

TABLE 2

| fs[Hz] | fs/100[Hz] | τ2[msec] | gain2 |
|---|---|---|---|
| 4 k | 40 | 500 | 0.95122 |
| 180 k | 1.8 k | 160 | 0.99653 |
| 2.4 M | 24 k | 550 | 0.999924 |

As the table 2 clearly shows, when the data rate fs is changed from 2.4 MHz to 24 kHz, though the second coefficient (gain2) has consecutive 9's down to four decimal places, it has different values after five decimal places. As a result, corresponding to the change of the data rate fs from 2.4 MHz to 24 kHz, the second multiplier 214 should handle the number of bits down to five to six decimal places of the second coefficient (gain 2). This can reduce the number of bits handled by the second multiplier 214.

The peak (maximal value) of the detection signal Vo output from the QP detector 20 is detected by the peak detector 30. The display 40 displays the peak detected by the peak detector 30 as a chart and the like.

According to the embodiment of the present invention, the level of the electric power signal Vi and the level of the detection signal Vo are compared by the comparator 202. As a result of the comparison, if the level of the electric power signal Vi is higher than the level of the detection signal Vo, the first switch 204 connects the terminal 204a and the terminal 204c with each other. As a result, the register 210, the first multiplier 212, and the adder 208 constitute a kind of positive feedback circuit. As a result, the operation as the charge circuit is carried out. Moreover, if the level of the electric power signal Vi is lower than the level of the detection signal Vo, the first switch 204 connects the terminal 204b and the terminal 204c with each other. As a result, the register 210 and the second multiplier 214 constitute a kind of discharge circuit. As a result, the operation as the discharge circuit is carried out.

In this way, since there are provided the function as the charge circuit ([Level of electric power signal Vi]>[Level of detection signal Vo]) and the function as the discharge circuit ([Level of electric power signal Vi]<[Level of detection signal Vo]) based on the relationship in magnitude between the level of the electric power signal Vi and the level of the detection signal Vo, the QP detection can be carried out. Moreover, since the comparator 202, the adder 208, the register 210, the first multiplier 212, the second multiplier 214, and the like are digital circuit elements, the QP detection unit can be made by using the digital circuit elements.

According to the embodiment of the present invention, the level of the electric power signal Vi and the level of the detection signal Vo are compared by the comparator 202. As a result of the comparison, if the electric power signal Vi is larger than the detection signal Vo, the second switch 206 connects the terminal 206a and the terminal 206c with each other. Consequently, the clock frequency fed to the latch 220 is the input data rate fs. If the level of the electric power signal Vi is less than the level of the detection signal Vo, the second switch 206 connects the terminal 206b and the terminal 206c with each other. As a result, the clock frequency fed to the latch 220 is represented as [Input data rate fs]/N (N=100, for example). Thus, the clock frequency fed to the latch 220 is smaller than the input data rate fs when the QP detector 20 provides the function of the discharge circuit.

As a result, it is possible to increase the change of the second coefficient (gain2) of the second multiplier 214 when the input data rate fs is changed. This can reduce the number of bits handled by the second multiplier 214.

The invention claimed is:

1. A digital QP detecting apparatus that detects an input signal and outputs a detection signal, comprising:
   a register that records an input digital data;
   a first multiplier that multiplies the digital data recorded in said register by a first coefficient, and outputs the product;
   a second multiplier that multiplies the digital data recorded in said register by a second coefficient, and outputs the product;
   an adder that adds the input signal and the output from said first multiplier to each other;
   a level comparator that compares the level of the input signal and the level of the detection signal with each other; and
   a first switch that switches the digital data fed to said register between an output from said adder and the output from said second multiplier based on a comparison result by said level comparator,
   wherein the detection signal is generated based on an output from said first switch.

2. The digital QP detecting apparatus according to claim 1, comprising a third multiplier that generates the detection signal by multiplying the output from said first switch by a third coefficient.

3. The digital QP detecting apparatus according to claim 2, wherein the third coefficient is obtained by subtracting the first coefficient from 1.

4. The digital QP detecting apparatus according to claim 1 wherein:
   said first switch:
   (i) selects the output from said adder as the digital data fed to said register if the level of the input signal is higher than the level of the detection signal; and
   (ii) selects the output from said second multiplier as the digital data fed to said register if the level of the input signal is lower than the level of the detection signal.

5. The digital QP detecting apparatus according to claim 1 comprising:
- a latch that records a signal based on the output from said first switch, and updates the recorded signal at a predetermined period; and
- a second switch that switches the reciprocal of the said predetermined period between the data rate of the input signal and a rate smaller than the data rate of the input signal based on the comparison result by said level comparator.

6. The digital QP detecting apparatus according to claim 5, wherein:
said second switch:
- (i) sets the reciprocal of the predetermined period to the data rate of the input signal if the level of the input signal is higher than the level of the detection signal; and
- (ii) sets the reciprocal of the predetermined period to the rate smaller than the data rate of the input signal if the level of the input signal is less than the level of the detection signal.

7. A spectrum analyzer comprising the digital QP detecting apparatus according to claim 1.

8. A spectrum analyzer comprising:
- an electric power signal converter that converts a signal to be measured to an electric power signal;
- the digital QP detecting apparatus according to claim 1 that detects the electric power signal and outputs a detection signal; and
- an extreme value detector that detects an extreme value of the detection signal.

9. A digital QP detecting method of detecting an input signal and outputting a detection signal, comprising:
- recording an input digital data;
- multiplying the digital data recorded in said recording step by a first coefficient, and outputting the product;
- multiplying the digital data recorded in said recording step by a second coefficient, and outputting the product;
- adding the input signal and the output from the step of multiplying the digital data by the first coefficient;
- comparing the level of the input signal and the level of the detection signal with each other; and
- switching the digital data recorded in said recording step between an output from said adding step and the output from the step of multiplying the digital data by the second coefficient based on a comparison result by said level comparing step,
wherein the detection signal is generated based on an output from said switching step.

* * * * *